United States Patent
Tanimoto et al.

(10) Patent No.: US 9,880,963 B2
(45) Date of Patent: Jan. 30, 2018

(54) COMMUNICATION DEVICE INCLUDING COMMUNICATION UNIT CONFIGURED TO COMMUNICATE VIA LOCAL AREA NETWORK (LAN) AND AT LEAST ONE I/O PORT THAT IS CONNECTABLE TO MANUFACTURING APPARATUS

(71) Applicant: Murata Machinery, Ltd., Kyoto-shi, Kyoto (JP)

(72) Inventors: Yoshifumi Tanimoto, Kyoto (JP); Katsutoshi Daikoku, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 404 days.

(21) Appl. No.: 14/434,813

(22) PCT Filed: Jun. 10, 2013

(86) PCT No.: PCT/JP2013/065949
§ 371 (c)(1),
(2) Date: Apr. 10, 2015

(87) PCT Pub. No.: WO2014/069029
PCT Pub. Date: May 8, 2014

(65) Prior Publication Data
US 2015/0269107 A1    Sep. 24, 2015

(30) Foreign Application Priority Data

Nov. 2, 2012  (JP) ................................ 2012-242657
Jan. 21, 2013 (JP) ................................ 2013-008225

(51) Int. Cl.
*G06F 13/00*    (2006.01)
*G06F 13/42*    (2006.01)
(Continued)

(52) U.S. Cl.
CPC .......... *G06F 13/4221* (2013.01); *G06F 13/20* (2013.01); *H01L 21/67733* (2013.01)

(58) Field of Classification Search
CPC .................... G06F 13/4221; H01L 21/67733
See application file for complete search history.

(56) References Cited

U.S. PATENT DOCUMENTS 6,918,581 B2 * 7/2005 Horiuchi ................. B65H 3/08
                                                          271/104
7,426,555 B2   9/2008 Campbell et al.
(Continued)

FOREIGN PATENT DOCUMENTS

JP    62-213346 A    9/1987
JP    04-000917 A    1/1992
(Continued)

OTHER PUBLICATIONS

Official Communication issued in International Patent Application No. PCT/JP2013/065949, dated Jul. 16, 2013.

*Primary Examiner* — Tammara Peyton
(74) *Attorney, Agent, or Firm* — Keating & Bennett, LLP

(57) ABSTRACT

A communication device includes a communication unit configured to communicate with a LAN, and IO ports connectable to a manufacturing apparatus, and a controller. The IO ports are configured and/or programmed to exchange ON/OFF signals including multiple bits with the manufacturing apparatus. The controller is configured and/or programmed to receive communication requests from communication destinations via the LAN, store network addresses of communication destinations and IO port designations, change a value of the ON/OFF signals of designated IO ports in accordance with requests from communication destinations, and transmit the ON/OFF signals of designated IO ports to communication destinations via the communication (Continued)

unit and the LAN in accordance with requests from the communication destinations.

13 Claims, 14 Drawing Sheets

(51) Int. Cl.
  *H01L 21/677* (2006.01)
  *G06F 13/20* (2006.01)

(56) References Cited

U.S. PATENT DOCUMENTS

| | | | |
|---|---|---|---|
| 7,720,956 | B2 | 5/2010 | Campbell et al. |
| 8,473,116 | B2* | 6/2013 | Hori .................... G05D 1/0297 701/2 |
| 8,897,914 | B2* | 11/2014 | Tokumoto ........... H01L 21/6773 700/213 |
| 2010/0308530 | A1* | 12/2010 | Todoriki ............... B65H 1/025 271/197 |
| 2016/0276192 | A1* | 9/2016 | Tanimoto .......... H01L 21/67733 |

FOREIGN PATENT DOCUMENTS

| | | |
|---|---|---|
| JP | 09-252378 A | 9/1997 |
| JP | 10-164114 A | 6/1998 |
| JP | 2009-135255 A | 6/2009 |
| WO | 2011/155040 A1 | 12/2011 |

\* cited by examiner

FIG. 8

COMMUNICATION DEVICE INCLUDING COMMUNICATION UNIT CONFIGURED TO COMMUNICATE VIA LOCAL AREA NETWORK (LAN) AND AT LEAST ONE I/O PORT THAT IS CONNECTABLE TO MANUFACTURING APPARATUS

BACKGROUND OF THE INVENTION

1. Field of the Invention

The present invention relates to a communication device as well as a communication apparatus and a communication system that include the communication device.

2. Description of the Related Art

In a communication system, transfer vehicles transfer articles to and from stations, and in the case of transferring semiconductors for example, the transfer vehicles perform communication for transfer with station-side terminals in accordance with the SEMI standard E84 (called E84 hereinafter) protocol. A transfer vehicle stops at a position facing a station and performs communication, and it is unclear whether or not the station side is prepared for transfer until E84 communication is started. For this reason, there are cases where the transfer vehicle stops and determines through E84 communication that transfer cannot be performed, and then the transfer vehicle departs from the station without transferring articles. Accordingly, the transfer vehicle makes needless stops, and there are cases where congestion occurs due to blocking the traveling route.

One reason why this problems occurs is that the transfer vehicle side is not provided with a means for finding out the statuses of stations at a position away from the stations. Note that WO 2011/155040, which is related to E84 communication, proposes a technique in which a transfer vehicle starts E84 communication directly upstream of a station, without stopping. However, since multiple transfer vehicles are traveling in actuality, enabling the transfer vehicles to perform E84 communication at a position other than directly upstream of the station as in conventional technology requires exclusive control in which multiple transfer vehicles do not control the same station at the same time.

SUMMARY OF THE INVENTION

Preferred embodiments of the present invention determine a status of a manufacturing apparatus by remotely detecting ON/OFF signals of IO ports that are capable of being connected to the manufacturing apparatus, and control operation of a transfer vehicle based on the status of the manufacturing apparatus. Preferred embodiments of the present invention also control the operation of the manufacturing apparatus by enabling remotely controlling of the IO ports.

Further preferred embodiments of the present invention enable a transfer vehicle and a fixed transfer vehicle controller on a ground side to communicate with a manufacturing apparatus via a communication device of another preferred embodiment of the present invention, without hindering the communication that the transfer vehicle performs with the manufacturing apparatus via an existing communication terminal.

Other preferred embodiments of the present invention enable a transfer vehicle that transfers articles to and from the manufacturing apparatus and a controller for the same to remotely detect the ON/OFF signals of the IO ports and remotely control the IO ports, and to control the operations of the manufacturing apparatus from the transfer vehicle as well.

Additional preferred embodiments of the present invention prevent multiple apparatuses from influencing the manufacturing apparatus at the same time by exclusively controlling the IO ports, and improve the efficiency of apparatuses transferring access articles to and from the manufacturing apparatus by enabling remote detection of the ON/OFF signals of the IO ports even in the case where exclusive control is performed.

A communication device according to a preferred embodiment of the present invention is a communication device including a communication unit configured to communicate with a LAN (Local Area Network), at least one IO port that is connectable to a manufacturing apparatus, and a controller, the at least one IO port being configured and/or programmed to exchange an ON/OFF signal including a plurality of bits with the manufacturing apparatus, and the controller being configured and/or programmed to receive communication requests from the communication destinations via the LAN, and store network addresses of the communication destination and data specifying the IO port designated by the communication destinations, change values of the ON/OFF signal of a designated IO port in accordance with requests from the communication destinations, and transmit the ON/OFF signal of the designated IO port to the communication destination via the communication unit and the LAN in accordance with requests from the communication destinations.

Also, a communication apparatus according to a preferred embodiment of the present included the above-described communication device; transfer vehicles configured to transfer articles to and from stations of a manufacturing apparatus and another controller configured and/or programmed to control a plurality of transfer vehicles defining the communication destinations, and the manufacturing apparatus including a communication terminal configured to communicate with the transfer vehicles and connected to a main body of the manufacturing apparatus by a communication line; and an adapter configured to be inserted into the communication line and be connected to the IO port, the communication apparatus being configured and/or programmed such that the adapter is able to switch between an adapter pass mode of relaying communication between the communication terminal and the main body and transmitting communication data to the IO port, and an adapter control mode of relaying communication between the manufacturing apparatus and the IO port if the communication terminal and the main body are not communicating.

Also, a communication system according to a preferred embodiment of the present included transfer vehicles configured to transfer articles to and from stations of a manufacturing apparatus; a controller configured and/or programmed to control transfer vehicles, and a manufacturing apparatus-side communication device, the communication device including a communication unit configured to communicate with a LAN, at least one IO port, and a controller, the IO port being configured and/or programmed such that the IO port is connectable to the manufacturing apparatus and exchanges an ON/OFF signal including a plurality of bits with the manufacturing apparatus, and the controller being configured and/or programmed to receive communication requests from the communication destinations via the LAN, the transfer vehicles and the controller defining the communication destinations, and store network addresses of transmission origins of requests from the communication destinations, and data specifying the at least one IO port designated by the communication destinations, change a value of the ON/OFF signal of a designated IO port in accordance with requests from the communication destinations, and transmit the ON/OFF signal of the designated IO port to the communication destinations via the communication unit and the LAN in accordance with requests from the communication destinations.

According to the communication device of a preferred embodiment of the present, the specification of the IO port, the detection of the ON/OFF signal thereof, and the changing of the value of the ON/OFF signal all are able to be remotely performed via the LAN.

In the case of a manufacturing apparatus that includes a communication terminal connected to the main body of a transfer vehicle by a communication line, an adapter connected to the IO port is preferably inserted into the communication line. Then, in the adapter pass mode, by relaying communication between the communication terminal and the main body, the transfer vehicle is able to communicate with the main body of the manufacturing apparatus via the communication terminal and the adapter, and the communication data is sent to the IO port of the communication device. Also, if communication is not being performed between the communication terminal and the main body, the manufacturing apparatus and the IO port are able to communicate with each other via the adapter in the adapter control mode. For this reason, the transfer vehicle communicates with the manufacturing apparatus via the communication terminal, and the transfer vehicle, the controller of the transfer system, and the like communicate with the manufacturing apparatus via the adapter.

A communication system according to a preferred embodiment of the present includes the communication device of one of the preferred embodiments of the present invention described above connected to the manufacturing apparatus, a transfer vehicle, and a controller configured and/or programmed to control the transfer vehicle (controller of the transfer system). In this system, the controller and the transfer vehicle detect the ON/OFF signal of the IO port connected to the manufacturing apparatus, and also change values of the ON/OFF signals, via the LAN.

In this specification, descriptions regarding the communication device also directly apply to a communication apparatus and a communication system.

Preferably, the communication device further includes a memory configured to store presence or absence of exclusive control of an IO port, the controller is configured and/or programmed to determine whether or not exclusive control of the designated IO port is necessary based on communication requests from the communication destinations, and in a case where communication requests from the communication destinations are received and the determination unit determined that exclusive control of the designated IO port is necessary, if statuses of the designated IO port correspond to an absence of exclusive control, a value of the ON/OFF signal of the designated IO port is changed in accordance with requests from the communication destinations, and stored data in the memory is changed such that exclusive control of the designated IO port is present, and if statuses of the designated IO port correspond to a presence of exclusive control, changing of the value of the ON/OFF signal of the designated IO port is denied, and in a case where communication requests from the communication destinations are received and the controller determined that exclusive control of the designated IO port is not necessary, the ON/OFF signal of the designated IO port is transmitted to the communication destinations via the communication unit and the LAN in accordance with the requests from the communication destinations regardless of the presence or absence of exclusive control of the designated IO port.

According to this configuration, it is possible to realize exclusive control of an IO port while enabling another apparatus to detect the ON/OFF signal of the IO port during exclusive control of the IO port. The exclusive control preferably is executed to transfer articles to and from the manufacturing apparatus, for example. Also, multiple transfer vehicles do not attempt to transfer articles to and from the same manufacturing apparatus at the same time, for example, and a transfer vehicle does not needlessly wait due to attempting to transfer an article to or from a manufacturing apparatus to or from which an article is being transferred, for example.

Preferably, transfer vehicles configured to transfer articles to and from stations of a manufacturing apparatus, and a controller configured and/or programmed to control a plurality of transfer vehicles are included as the communication destinations, and the communication device transmits the ON/OFF signal of the designated IO port to the controller via the communication unit. According to this configuration, the transfer vehicle and the controller detect the ON/OFF signal of desired IO port via the LAN. Accordingly, the transfer vehicle is operated efficiently.

Preferably, the communication device includes a network address, and data specifying port is provided to the IO port. According to this configuration, communication destinations preferably specify an IO port and communicate with the communication device.

Particularly preferably, the communication device is configured and/or programmed such that the controller and a transfer vehicle access the ON/OFF signal of the designated IO port.

Also, preferably, a peripheral device other than the manufacturing apparatus is connected to the IO port, and is configured and/or programmed such that status data regarding the peripheral device is accessible by the controller and a transfer vehicle. The peripheral device is, for example, a sensor configured to ensure safety related to the transfer of articles, a sensor configured to check the situation in the periphery of a station to transfer articles to or from the manufacturing apparatus, a terminal configured to manually operate a station, or the like. According to this configuration, manufacturing apparatus-side situations, including the status of the peripheral device, are detected.

Preferably, the at least one IO port is configured and/or programmed to switch between a state of being connected to the adapter and a state of directly communicating with a terminal of the manufacturing apparatus. According to this configuration, the communication device according to a preferred embodiment of the present is able to be connected to the main body of a manufacturing apparatus connected to the communication terminal via the communication line, and to a manufacturing apparatus that does not include such a communication terminal.

Preferably, the adapter of the communication apparatus includes a switch inserted into the communication line, and a second communication line branched from the communication line and connected to the IO port, and the IO port is configured and/or programmed to watch communication with the main body in the adapter control mode and in the adapter pass mode. Due to the above-described switch, it is possible to switch between the adapter control mode and the adapter pass mode, and the IO port is able to watch communication with the main body and the communication terminal at all times due to the second communication line.

Preferably, if an abnormality of the communication unit is detected, the communication apparatus changes the IO port set to the adapter control mode to the adapter pass mode. According to this configuration, the adapter pass mode defines and functions as a fail-safe mechanism against abnormalities in the communication unit.

Preferably, the communication apparatus receives instructions from transfer vehicles via the communication unit, and changes the IO port set to the adapter control mode to the adapter pass mode. The transfer vehicle remotely start communication with the manufacturing apparatus in the adapter control mode, and then upon arriving at the manufacturing apparatus, communicate with the manufacturing apparatus via the communication terminal in the adapter pass mode.

Preferably, the controller that controls the transfer vehicles changes transfer instructions or stops transfer based on an ON/OFF signal of the designated IO port. According to this configuration, article deliveries, transfer attempts, and the like that are needless due to a station not being prepared for article transfer are eliminated. Note that a station preferably is a piece of equipment of the manufacturing apparatus for the transfer of articles by a transfer vehicle.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a diagram showing an example of an IO port management table of a communication device.

DETAILED DESCRIPTION OF THE PREFERRED EMBODIMENTS

Figure 1:
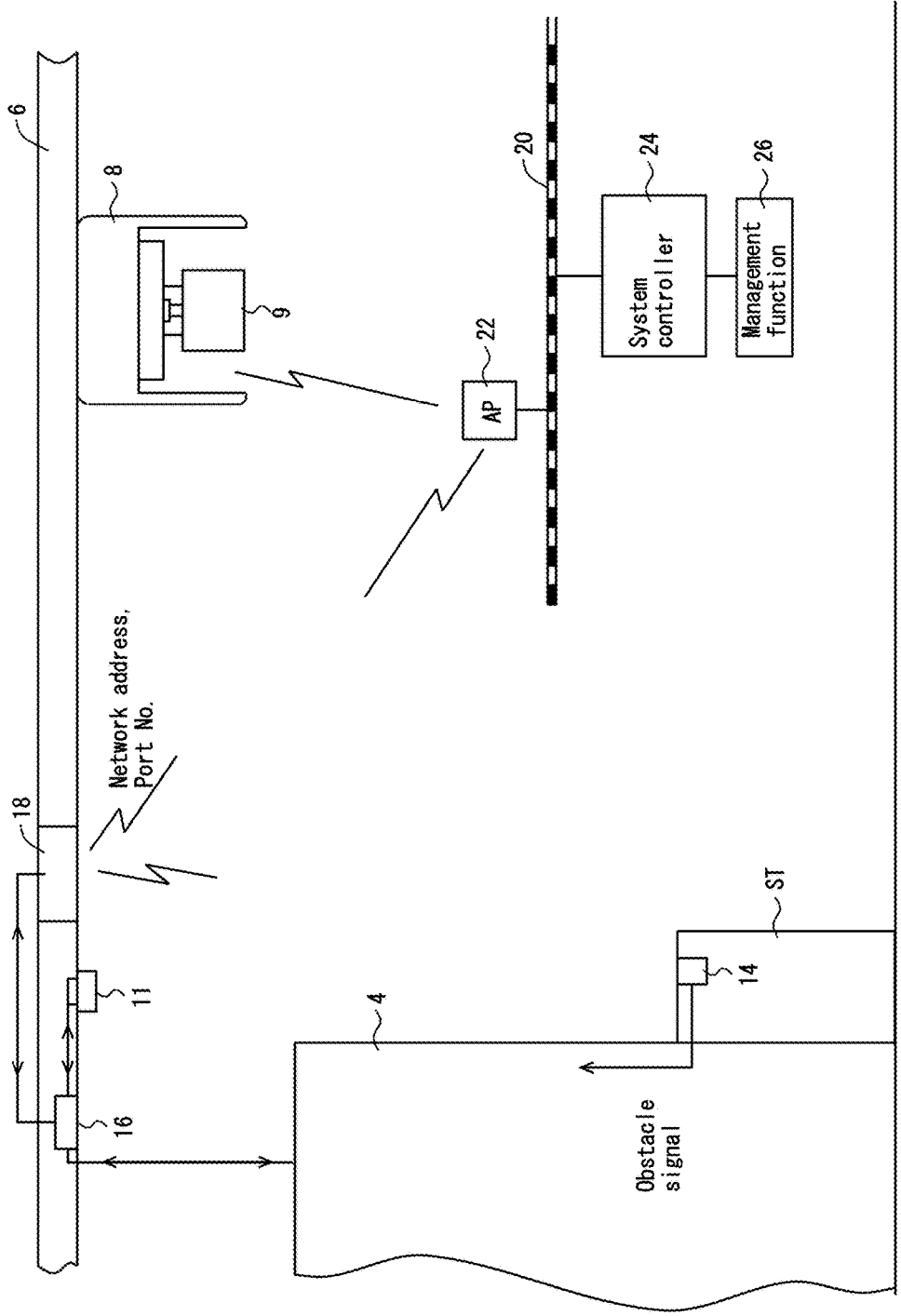
FIG. 1 is a diagram showing a communication system according to a preferred embodiment of the present invention and the surrounding environment thereof.

The following describes preferred embodiments of the present invention. The scope of the present invention is based on the claims, and is intended to be determined in accordance with the understanding of a person skilled in the art with reference to the description of the present invention and related art in the field of the present invention.

First Preferred Embodiment

FIGS. 1 to 5 show a first preferred embodiment of the present invention using an example of transferring semiconductors, but the transfer of workpieces by a loader, the transfer of thread packages by a maintenance carriage, and the like are similar to this example and thus included in this preferred embodiment. In these figures, 4 indicates a semiconductor manufacturing apparatus, an inspection apparatus, or the like, which will be referred to as a manufacturing apparatus 4 here. The manufacturing apparatus 4 includes one or more stations ST, and transfers an article 9 such as an FOUP (Front-Opening Unified Pod) to and from an overhead traveler 8. Note that the overhead traveler 8 travels through a ceiling space along a rail-shaped traveling route 6, and a ground-traveling automatic guided vehicle or the like may be applied as the transfer vehicle.

Before articles are transferred between the stations ST and the overhead traveler 8, the manufacturing apparatus 4 performs optical communication with the overhead traveler 8 via E84 communication terminals 11 provided in respective stations ST. Also, several hundred overhead travelers 8 travel along the traveling route 6, and a system controller 24 performs communication with individual overhead travelers 8 and controls the overhead travelers 8 via a LAN 20 and an access point 22. Note that the overhead travelers 8 travel in one direction and are prohibited from traveling in the opposite direction. The controller 24 is configured and/or programmed to perform a management function 26 to manage the statuses of the stations. Note that the management function 26 may be physically independent of the system controller 24.

16 indicates an adapter, 18 indicates a communication device such as a device server, and a communication apparatus of this preferred embodiment preferably is configured by these elements. The adapter 16 is inserted between the manufacturing apparatus 4 and the E84 communication terminal 11, and the communication device 18 communicates with multiple adapters 16 for example, via wires, Wi-Fi (Wireless Fidelity), or the like, and communicates with the access point 22 via a wireless LAN, Wi-Fi, or the like. 14 indicates an obstacle detector that preferably includes a person sensor, switches, or the like, and detects the existence of an obstacle such as a person in the vicinity of a station ST and transmits a notification to the communication device 18 via Wi-Fi or the like. A communication system of this preferred embodiment is configured by the elements from the overhead traveler 8 to the management function 26 in FIG. 1.

Figure 2:
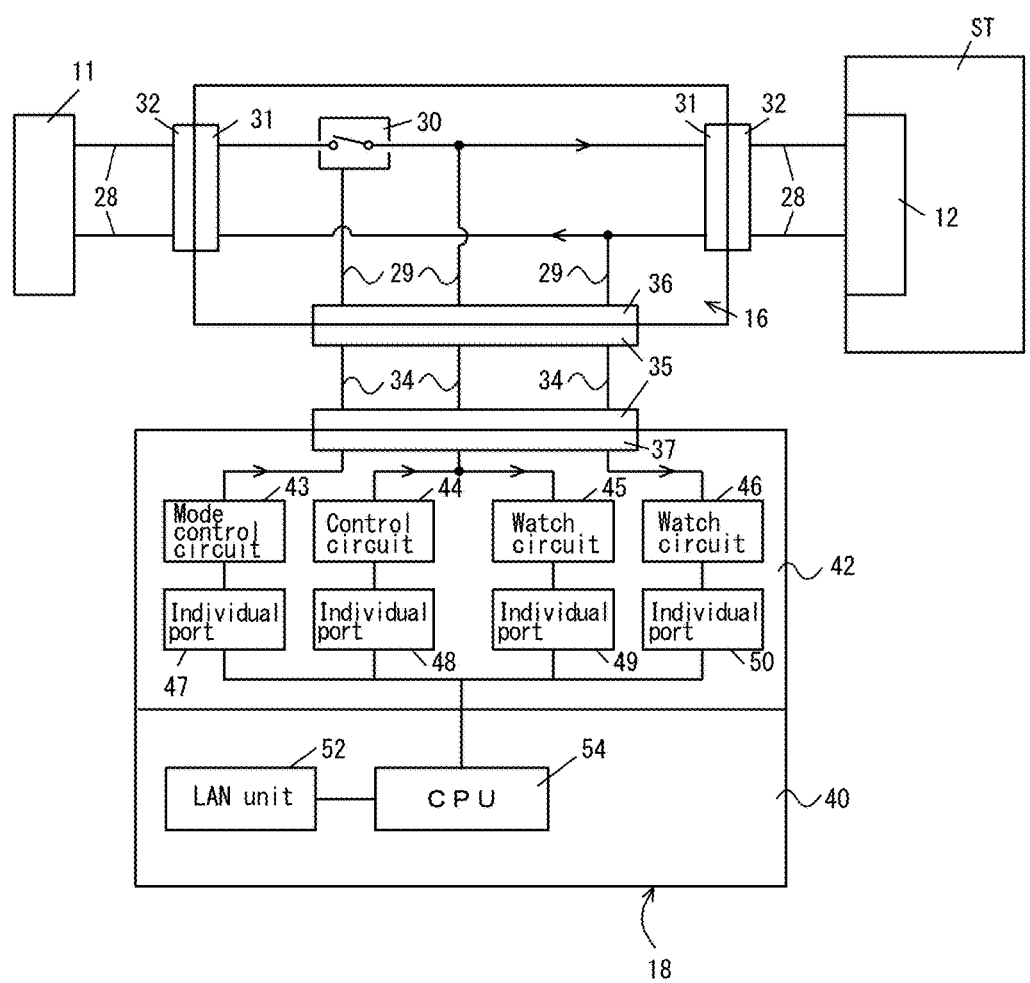
FIG. 2 is a block diagram of a communication apparatus according to a preferred embodiment of the present invention.

FIG. 2 shows the configuration of the adapter 16 and the communication device 18. 12 indicates a station terminal, which is a communication terminal on the station ST side. 28 indicates wired parallel communication lines between the E84 communication terminal 11 and the station terminal 12, and the number of lines shown is smaller than in actuality. The adapter 16 uses a switch 30 to switch ON/OFF the connection of communication lines 28 between the E84 communication terminal 11 and the station terminal 12 on the station ST side. The state in which the connection is OFF is called the adapter control mode, and the state in which the connection is ON is called the adapter pass mode. Note that 31 and 32 indicate connectors for connection with the communication lines 28. Also, 29 indicates second communication lines that branch out from the communication lines 28. Note that the switch 30 is illustrated as a switch including a mechanical connection point for the sake of convenience in FIG. 2, but it is preferable to apply a semiconductor switch.

The communication device 18 preferably includes a main circuit board 40 and an adapter board 42 for each IO port connected to the adapter 16, and although five adapter boards 42 are preferably included, for example, only one of them is illustrated. 34 indicates wired communication lines, and 35 to 37 indicate connectors. A mode control circuit 43 controls the switch 30, and a control circuit 44 sends signals to the station terminal 12 in the adapter control mode. Watch circuits 45 and 46 watch signals transmitted along the communication lines 28, and 47 to 50 indicate individual ports. Note that the individual ports 47 to 50 are each assigned a port number, and the port numbers need only be numbers that uniquely specify which adapter 16 the port is associated with. The communication device 18 watches signals from the transfer vehicle via the E84 communication terminal 11 in the adapter pass mode, and watches signals from the station terminal 12 in the adapter pass mode and in the adapter control mode. These signals are signals related to the transfer of articles and are based on the E84 protocol, for example.

Figures 4, 5:
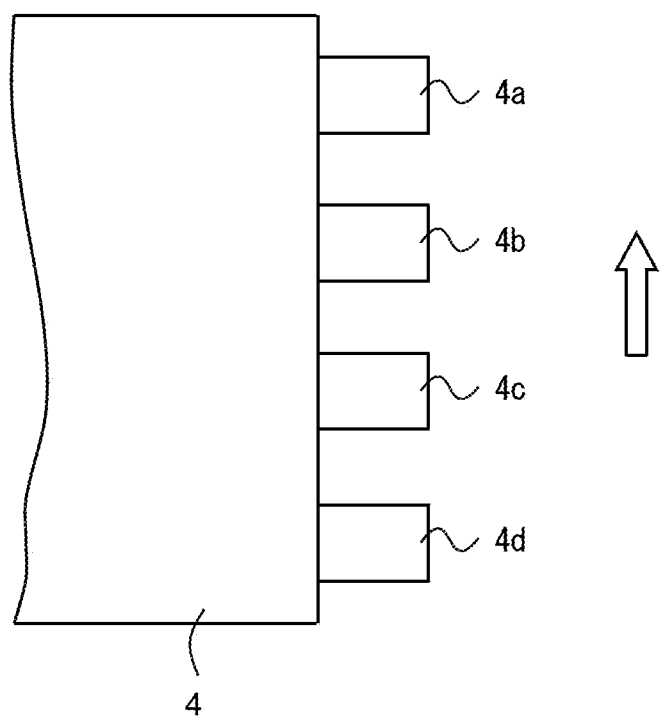
FIG. 4 is a diagram schematically showing the dynamic layout of stations in a preferred embodiment of the present invention.
FIG. 5 is a diagram showing signals on communication lines in an adapter pass mode and an adapter control mode in a preferred embodiment of the present invention.

FIG. 5 shows signals on the communication lines 28 in the adapter pass mode (IO port P1) and the adapter control mode (IO port P2), with OUT indicating signals from the communication device 18 or the E84 communication terminal 11, and IN indicating signals from the station terminal 12. These signals are transferred to the management function 26 via the LAN and stored therein. For this reason, data corresponding to FIG. 5 is accumulated in the management function 26 for all of the stations.

The CPU 54 is configured and/or programmed to perform overall control of the communication device 18, and a LAN unit 52 communicates with the access point 22 in FIG. 1. The LAN unit 52 stores a network address (IP address) for each communication device 18 and port numbers specifying the adapters 16, and one communication device 18 manages multiple adapters 16 in principle. In communication between the LAN unit 52 and the system controller 24, the port number is added to the network address of the communication device 18 in order to specify which station ST the signal is related to.

Figure 3:
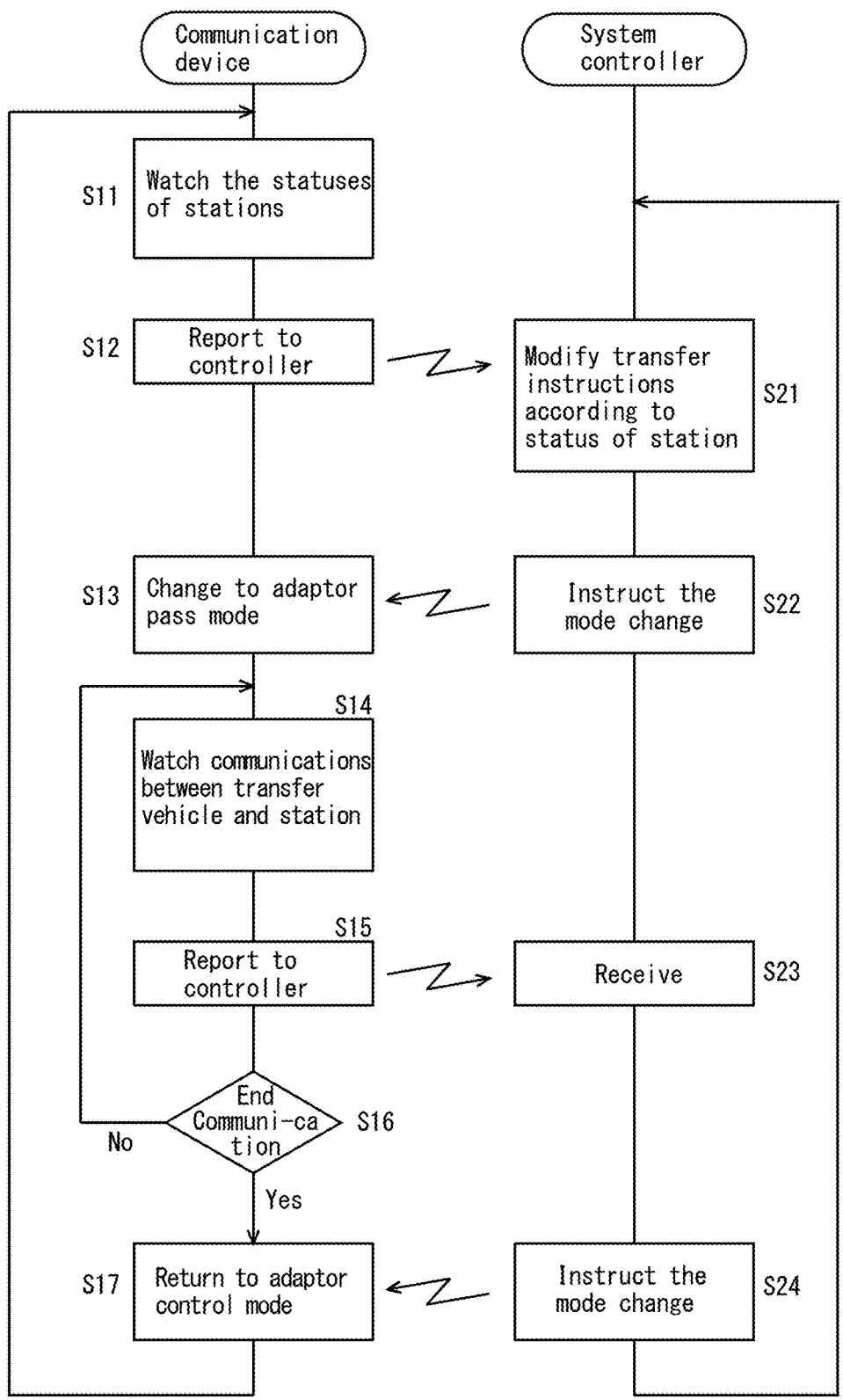
FIG. 3 is a flowchart showing operations of a communication device and a system controller in a preferred embodiment of the present invention.

FIG. 3 shows processing in the communication device 18 and the system controller 24. The adapter 16 is normally placed in the adapter control mode, in which communication between the E84 communication terminal 11 and the station terminals 12 is not possible and communication between the communication device 18 and the station terminals 12 is possible, and the communication device 18 watches the statuses of the stations ST using signals from the station terminals 12 (step 11). The communication device 18 reports the statuses of the stations ST to the system controller 24 (step 12), and the system controller 24 stores the statuses of the stations ST in the management function 26. The system controller 24 also modifies transfer instructions according to the statuses of the stations ST (step 21).

The system controller 24 manages the positions, statuses, and the like of the overhead travelers 8 in real-time, and therefore, when an overhead traveler 8 approaches a station ST in order to transfer an article, a mode change in an adapter 16 is instructed (step 22), and the communication device 18 changes the status of the adapter 16 from the adapter control mode to the adapter pass mode (step 13). Note that a configuration is possible in which a communication request from an overhead traveler 8 is watched for more toward the E84 communication terminal 11 than the switch 30, and a change from the adapter control mode to the adapter pass mode is made when a communication request is detected. According to this configuration, an article transfer is executed even in the case of the arrival of an overhead traveler 8 not in the schedule in the system controller 24.

In the adapter pass mode, communication between the E84 communication terminal 11 and the station terminals 12 is possible, communication between the communication device 18 and the station terminals 12 is not possible in principle, and the communication device 18 watches the statuses of the stations ST and the transfer of articles using signals on the communication lines 28 (step 14). The overhead traveler 8 communicates with the E84 communication terminal 11 using optical communication or the like, this signal is transferred to the station terminal 12, and the E84 protocol for article transfer is executed. Also, signals between the overhead traveler 8 and the station terminal 12 are transferred from the communication device 18 to the system controller 24, and the system controller 24 manages the transfer execution situation (step 23). When communication between an overhead traveler and the E84 communication terminal 11 ends (step 16), the mode of the adapter 16 is returned to the adapter control mode due to an instruction from the system controller 24 for example (steps 17 and 24). Note that the mode of the adapter 16 may be returned to the adapter control mode due to the communication device 18 receiving a transfer end confirmation signal transmitted between the overhead traveler and the E84 communication terminal 11, rather than due to control by the system controller 24. In the adapter pass mode, conventional communication is capable of being executed between the overhead traveler 8 and the station terminal 12, and the adapter 16 monitors the communication.

The overhead traveler 8 also includes a communication unit that performs communication via the LAN 20. The overhead traveler 8 can find out the status of a station using data in the management function 26. Before arriving at a drop-off or pick-up station, the overhead traveler 8 starts a procedure for article transfer with the station in the adapter control mode via the LAN 20. Also, after the article transfer, the overhead traveler 8 executes an article transfer completion procedure with the station in the adapter control mode while starting to travel. Accordingly, the overhead traveler 8 is able to start traveling before executing the transfer completion procedure.

According to the above configuration, the system controller 24 manages the statuses of the stations ST. For example, if the station ST that is the travel destination of the overhead traveler 8 is not in a state in which an article can be transferred, it is possible to instruct the overhead traveler 8 in advance to pass the target station ST and travel in a loop, or perform article transfer with another station. Accordingly, the overhead traveler does not needlessly stop or slow down and cause congestion. The system controller 24 cannot find out the statuses of the stations ST until transfer is requested by a production management controller (not shown), or until a transfer request is received from a production management controller in the conventional example. In this preferred embodiment of the present invention, the system controller 24 is configured and/or programmed to recognize the existence of a transfer article or the like at a station ST before a request is received from a production management controller. Accordingly, the system controller 24 is configured and/or programmed to, for example, dispatch an available overhead traveler 8 to an intra-bay route (bay-unit loop route) to which the station ST belongs. Also, if an article that is to be transferred to the station ST next is already known on the system controller 24 side, the transfer of the article to the station ST is able to be started before a request is received from the production management controller.

The overhead traveler 8 transfers an article by lowering an elevation platform directly above the station ST, and therefore there are cases where the elevation platform or the article interferes with a person or the like in the vicinity of the station ST. For this reason, the overhead traveler 8 is equipped with an obstacle sensor or the like, and obstacles in the vicinity of the station ST are detected. However, it is difficult to reliably detect a person in the vicinity of the station ST from the vicinity of the ceiling. In contrast, it is easy to prohibit transfer with the overhead traveler by pressing a switch provided on the station ST, or detecting a person with a person sensor provided on the station ST. In view of this, interference between a person and the overhead traveler is reliably prevented by, with use of signals from the obstacle detector 14, maintaining the status of the adapter 16 in the adapter control mode and prohibiting communication between the overhead traveler 8 and the station terminal 12, or even in the adapter pass mode, interrupting the prohibition of transfer with the overhead traveler 8 and making a notification, or the like. Note that the obstacle detector 14 performs communication with the communication device 18 via a wire or the LAN 20, for example.

In a manufacturing apparatus 4 that includes multiple stations ST and processes semiconductors in multiple FOUPs in one batch, there are cases where it is not important which station ST articles are transferred to or from. This situation is shown in FIG. 4. The manufacturing apparatus 4 includes four stations ST4a to ST4d, for example, and the overhead traveler travels in the direction of the arrow in the figure. The system controller 24 manages, in real-time, at the specific ones of the stations ST4a to ST4d that transfer articles have appeared by communication with the communication device 18, and therefore transfer instructions given to the overhead traveler are changed such that, among the stations at which transfer articles have appeared, articles are transferred from the most downstream station first, and articles are transferred from the most upstream station last. If articles are transferred from the downstream station first, it is possible to prevent overhead traveler congestion among the stations ST4a to ST4d. Similarly, overhead traveler congestion is prevented when articles are dropped off at the stations ST4a to ST4d by changing the transfer instructions such that articles are dropped off at the most downstream station among the empty stations with priority.

Although application to an overhead traveler system is described in the present preferred embodiment, for example, the present preferred embodiment is capable of being similarly applied to a maintenance carriage for a textile machine unit, a loader for a multi-spindle machine tool, or the like. Also, the switching between the adapter control mode and the adapter pass mode may be performed regularly at a cycle of about 10 ms to about 100 ms, for example, and the transfer vehicle may be caused to wait for this cycle or more if communication is not possible.

Second Preferred Embodiment

Figure 6:
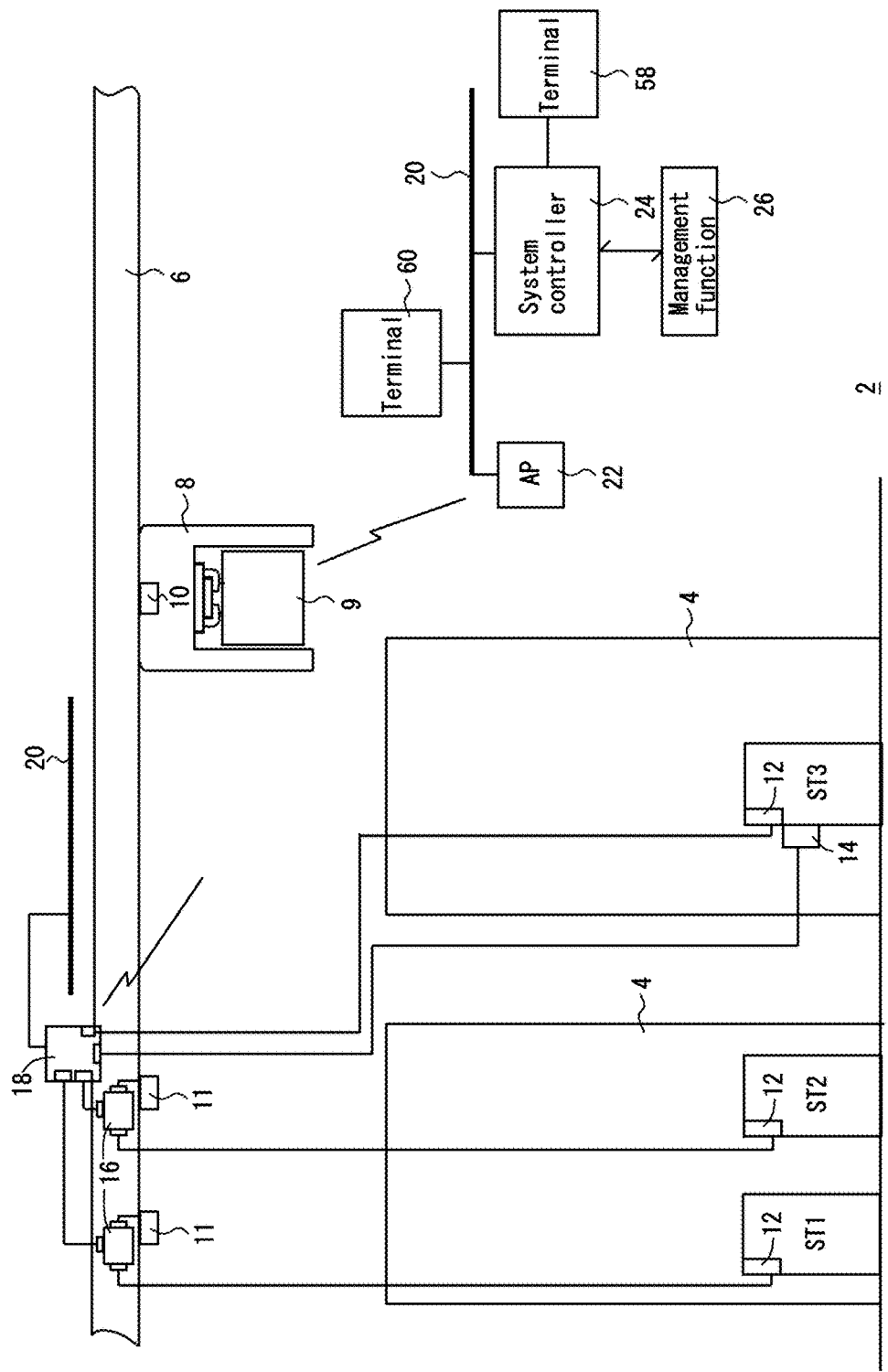
FIG. 6 is a diagram schematically showing a usage environment of a communication device according to a preferred embodiment of the present invention.

FIGS. 6 to 13 show a second preferred embodiment of the present invention of a communication system 2 and the communication device 18, and reference numbers that are the same as in the first preferred embodiment shown in FIGS. 1 to 5 indicate the same members, and aspects not described below are similar to the first preferred embodiment. In FIG. 6, 4 indicates a manufacturing apparatus, which is a semiconductor processing apparatus, a fiber processing apparatus, a machine tool, or the like, and includes one or more stations ST1 to ST3 and transfers articles 9 to and from overhead travelers 8 as examples of a transfer vehicle. A ground-traveling automatic guided vehicle, a loader for a machine tool, a maintenance carriage for a textile machine, or the like may be used instead of the overhead traveler 8. Note that the overhead travelers 8 travel in one direction along a traveling route 6. The stations ST1 to ST3 each include a station terminal 12, the overhead travelers 8 each include an E84 communication terminal 10, E84 communication terminals 11 are connected to the station terminals 12 via adapters 16, and the E84 communication terminals 11 are supported to the traveling route 6. 18 indicates a communication device such as a device server, and includes multiple IO ports. The IO ports preferably include the following three types of modes:

Control mode (mode in which the adapter 16 is not used),
Adapter control mode (mode in which the communication device 18 and the station terminal 12 communicate via the adapter 16), and
Adapter pass mode (mode in which the overhead traveler 8 communicates with the station terminal 12 via the adapter 16, the E84 communication terminal 10, and the E84 terminal 11).

Multiple communication devices 18 are provided in the communication system 2. Also, in the control mode, the station terminals 12 are directly connected to the communication devices 18, and are not connected to the E84 communication terminals 11.

20 indicates a LAN, and the overhead travelers 8 are connected to the LAN 20 via the access point 22, and the system controller 24 and the like are connected to the LAN 20. The communication devices 18 are connected to the LAN 20 via the access point 22 by Wi-Fi or the like, or are directly connected to the LAN with wires. The system controller 24 is configured and/or programmed to perform the management function 26, which stores the current values of data from the communication devices 18 (data regarding the statuses of the stations), and saves past data from the communication devices 18. Furthermore, the management function 26 is able to search for and edit data from the communication devices 18. Based on the data in the management function 26, it is possible to obtain the number of transfers for each station, the distribution of wait time from when an article is carried out from the manufacturing apparatus until the article is transferred to a station, the distribution of wait time from when a request for the transfer of an article to a station is given to the system controller until transfer is performed, and the like.

A terminal 58 is connected to the system controller 24, changes transfer instructions to be sent to the overhead travelers 8, analyzes the statuses of stations, changes operation rules of the communication system 2, and the like. Also, the changing of transfer instructions, the analysis of the statuses of stations, the changing of operation rules of the communication system 2, and the like are able to be similarly performed from a fixed or portable terminal 60 as well.

Figure 7:
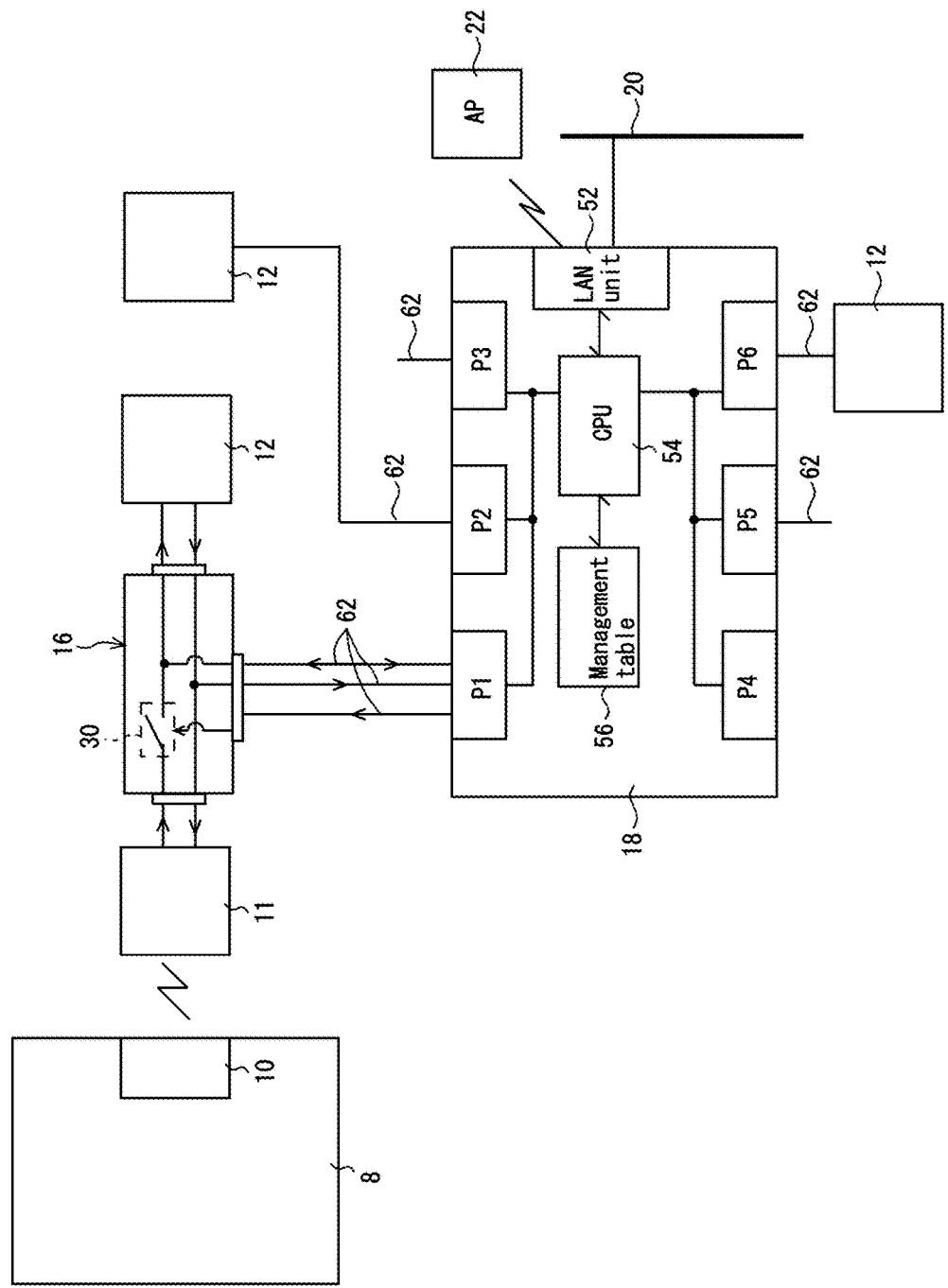
FIG. 7 is a block diagram showing a communication device and an accompanying adapter.

FIG. 7 shows the communication device 18 and the adapter 16. The communication device 18 includes IO ports P1 to P6, and the IO ports P1 to P6 each include a communication cable 62 preferably including 17 or 24 communication lines or the like, for example, and are connected to adapters 16 or station terminals 12. For example, there preferably are 17 communication lines in the communication cable 62, namely 8 lines for communication to station terminals 12, 8 lines for communication from station terminals 12, and one line for switching a switch 30 of an adapter 16. The ON mode of the switch 30 is the adapter pass mode, the off mode is the adapter control mode, and the mode of no connection with the adapter 16 is the control mode.

The CPU (central processing unit) 54 controls the IO ports P1 to P6, the LAN unit 52, the management table 56, and the like. The LAN unit 52 is connected to the LAN 20 either wirelessly via the access point 22, or directly via a wire, and communicates with the overhead travelers 8, the system controller 24, the terminal 60, and the like. The management table 56 temporarily stores the mode of each IO port and the communication data thereof. The communication device 18 is specified by a network address such as an IP address or a MAC address, and the IO ports are specified by adding port numbers to the network address of the communication device 18. Also, the IO ports correspond to peripheral devices in the communication system such as the station terminals 12, and the management table 56 stores the network address of the communication device, the port numbers, data specifying the peripheral devices that correspond to the IO ports, the modes, and communication data at the ports. The significance of the port data is determined based on the mode of the port, for example, and interpretation rules for this data are stored in the management function 26 of the system controller 24 and the overhead travelers 8.

Figure 8:
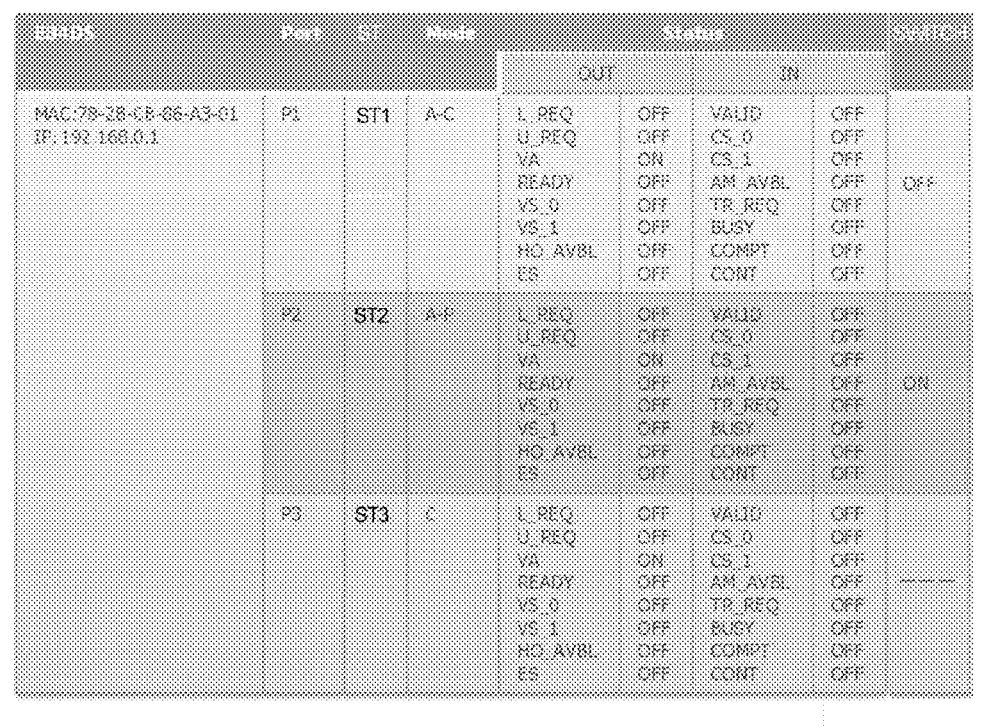

FIG. 8 shows an example of data in the management table 56. A MAC address and an IP address are stored as data specifying the communication device 18, and station numbers corresponding to the IO port numbers as well as IO port modes are stored. Communication data passing through the IO ports, which here is 8-bit IN/OUT data transmitted by E84 communication, is also stored. Also, in the case of an IO port that is connected to an adapter 16, ON/OFF data regarding the switch 30 is also stored, whereas data regarding the switch 30 does not exist in the control mode. Note that ON/OFF data regarding the switch 30 is redundant with the mode data, and at least one of them is stored.

Figure 9:
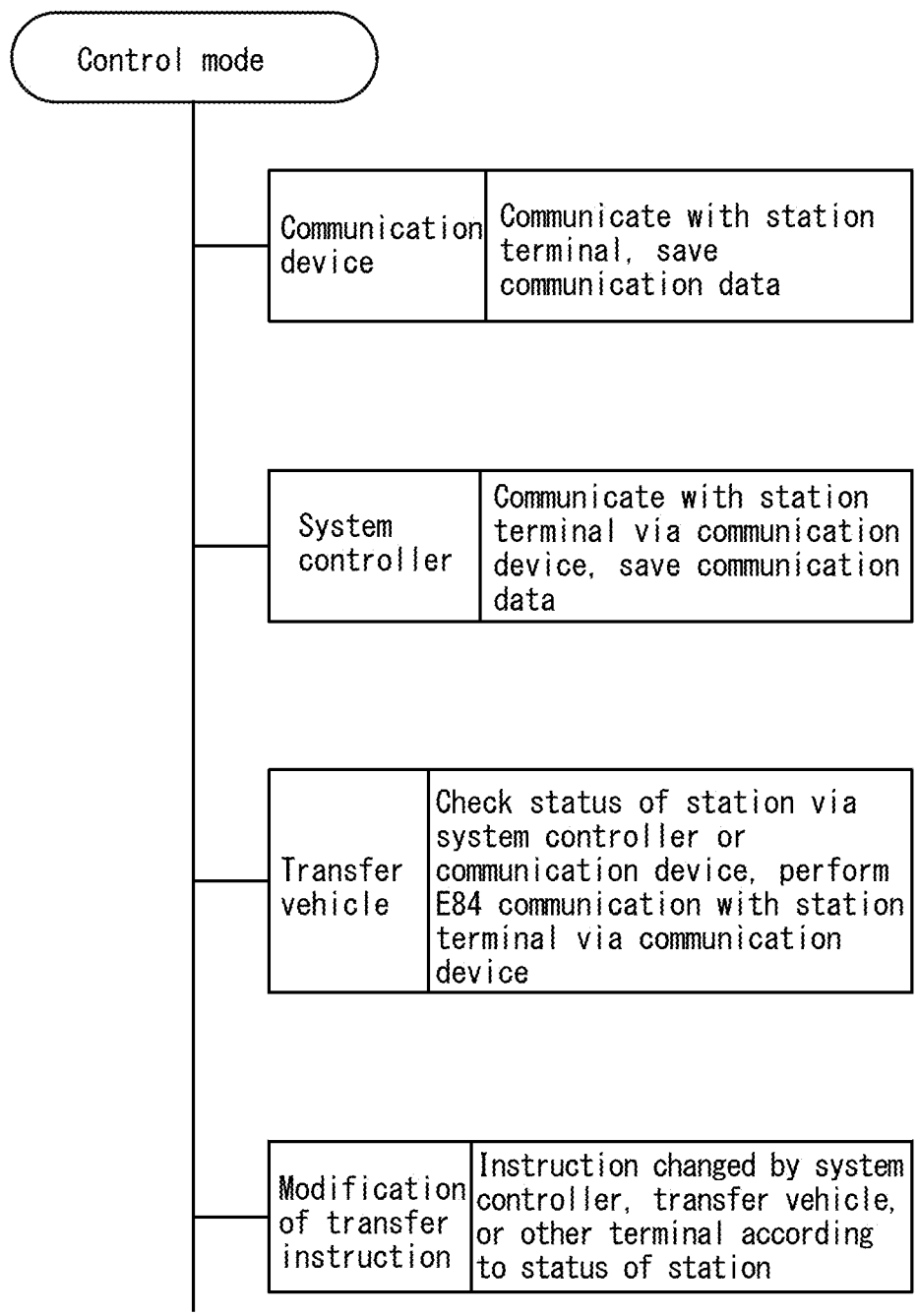
FIG. 9 is a diagram showing processing in a control mode.
Figure 10:
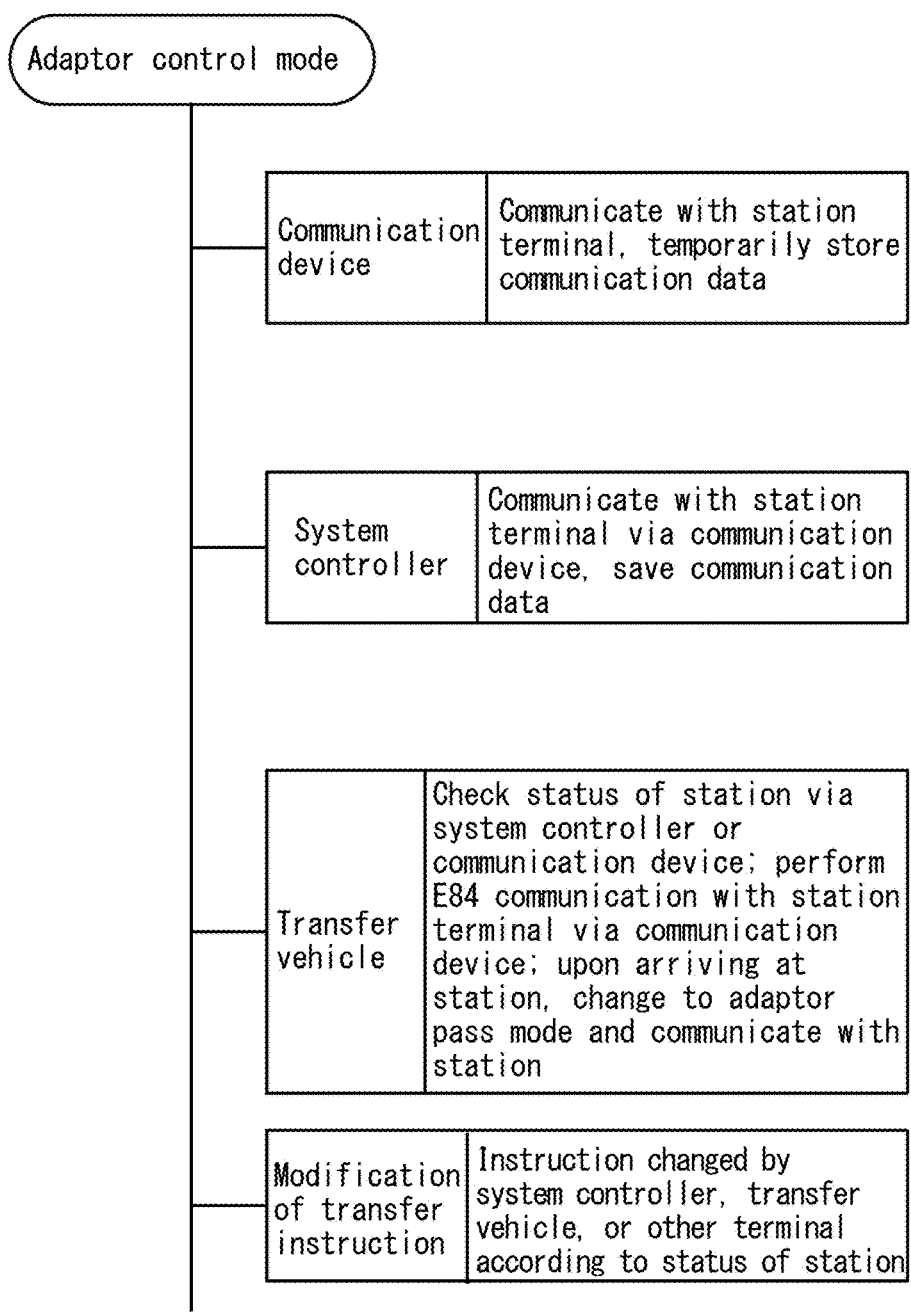
FIG. 10 is a diagram showing processing in the adapter control mode.
Figure 11:
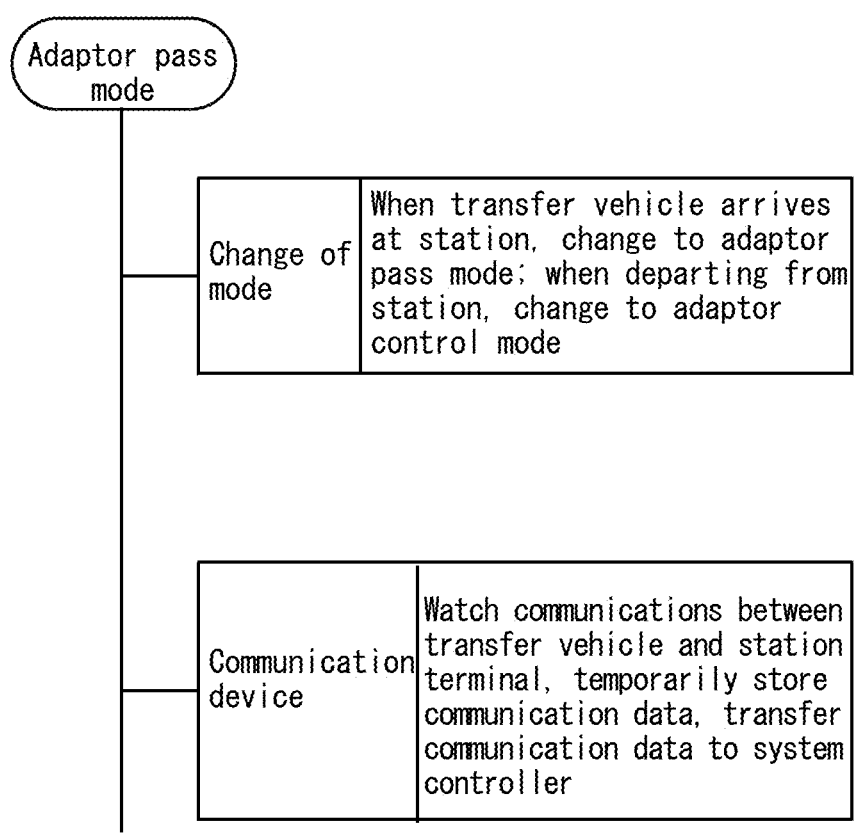
FIG. 11 is a diagram showing processing in the adapter pass mode.

FIGS. 9 to 11 show the three types of IO port modes. In the control mode in FIG. 9, the IO port communicates with the station terminal 12 and does not communicate with the E84 communication terminal 11, and the communication data (in this case, 16-bit E84 communication data) is temporarily stored in the management table 56. The system controller 24 communicates with the communication device 18, and data regarding each IO port is saved in the management function 26. By communicating with the system controller 24 or communicating with the communication device 18, a transfer vehicle such as an overhead traveler 8 can determine the status of a station (whether or not the station is ready for transfer) at a location away from the station. A pre-transfer procedure is completed by E84 communication upon arriving at or before arriving at the station, article transfer is performed, and then the transfer vehicle departs. Then, after departure for example, a post-transfer completion procedure is executed by E84 communication after transfer completion.

Although the main peripheral devices in the communication system 2 preferably are the stations, there are other peripheral devices such as fire doors, charging apparatuses for the overhead travelers 8, and lifters that raise and lower the overhead travelers 8 from and to a maintenance area. These peripheral devices are independent of the system controller 24 and often do not have a communication function. In view of this, these peripheral devices are connected to the communication device 18, their statuses are stored and managed by the management function 26 of the system controller 24, and instructions from the system controller 24 and the like are transmitted thereto. Also, there are cases where there is interference between a person and an article 9 from the overhead traveler 8 at a station. For example, in the case where a person attempts to transfer an article to or from a station or the like, there is the risk of interference if the overhead traveler 8 lowers an article. In view of this, as shown in FIG. 6, an obstacle detector 14 including a person detection sensor, switches, and the like is provided, and the access of a station by a person is detected. The obstacle detector 14 is connected to an IO port of the communication device 18, or a communication line from the station terminal 12 and a communication line from the obstacle detector 14 are connected to the IO port, thus making it possible to detect the presence or absence of an obstacle on the communication device 18 side. If this data is accessed by the overhead traveler 8, interference between the overhead traveler 8 and a person is reliably prevented.

If the statuses of stations are accessed by the system controller 24, the overhead traveler 8, the terminals 58 and 60, and the like, transfer instructions are capable of being changed. For example, if transfer to a downstream station is to be prioritized among stations that are arranged from upstream to downstream along the traveling route, an overhead traveler that is stopped for transfer does not hinder transfer performed by an upstream overhead traveler. In view of this, if transfer is capable of being performed with any of multiple stations, the transfer instructions are changed such that the downstream station is prioritized as long as it is ready for transfer. Also, if an article for which transfer is urgent, such as a rush product, exists, the transfer instructions are capable of being changed such that when a station becomes ready, the overhead traveler immediately travels to that station.

FIG. 10 shows processing in the adapter control mode. In the adapter control mode, the overhead traveler 8 communicates with a station terminal 12 via the communication device 18 and an adapter 16. In particular, the facts that pre-transfer E84 communication is completed before stopping and that post-transfer E84 communication is completed at the same time as departure or after departure are similar to the control mode. The communication data in these cases is monitored by the communication device 18 and stored in the management table 56 and the management function 26. Other aspects are similar to the control mode.

FIG. 11 shows processing in the adapter pass mode. In the adapter pass mode, the overhead traveler 8 arrives at a station, and article transfer is performed via a conventional E84 communication terminal 11. In the adapter pass mode, the overhead traveler 8 communicates with a station terminal 12 via an adapter 16, and communication data is monitored by the communication device 18 and temporarily stored in the management table 56 as well as transferred to the management function 26. Aspects other than communication with the station terminal 12 are the same as in the control mode.

Also, by switching the switch 30 upon receiving an instruction from a controller or the like via a LAN unit, it is possible to dynamically change between the adapter pass mode and the adapter control mode. For example, if an overhead traveler is not equipped with a function to communicate with a communication device via a LAN, the system controller gives the communication device an instruction such that the overhead traveler executes transfer, and thus a predetermined station is capable of being changed to the adapter pass mode.

Furthermore, if the controller detects that transfer is occurring frequently, and it is possible for the communication on the LAN to be excessive, the communication device and the overhead travelers are instructed such that the IO ports corresponding to several stations are changed to the adapter pass mode, and the overhead travelers also perform conventional communication with stations in the adapter pass mode. This makes it possible to alleviate the communication load on the network. Alternatively, if the communication device detects that an abnormality has occurred in the communication unit, IO ports set to the adapter control mode in the communication device are changed to the adapter pass mode. This makes it possible to prevent obstruction of transfer.

Third Preferred Embodiment

Figure 12:
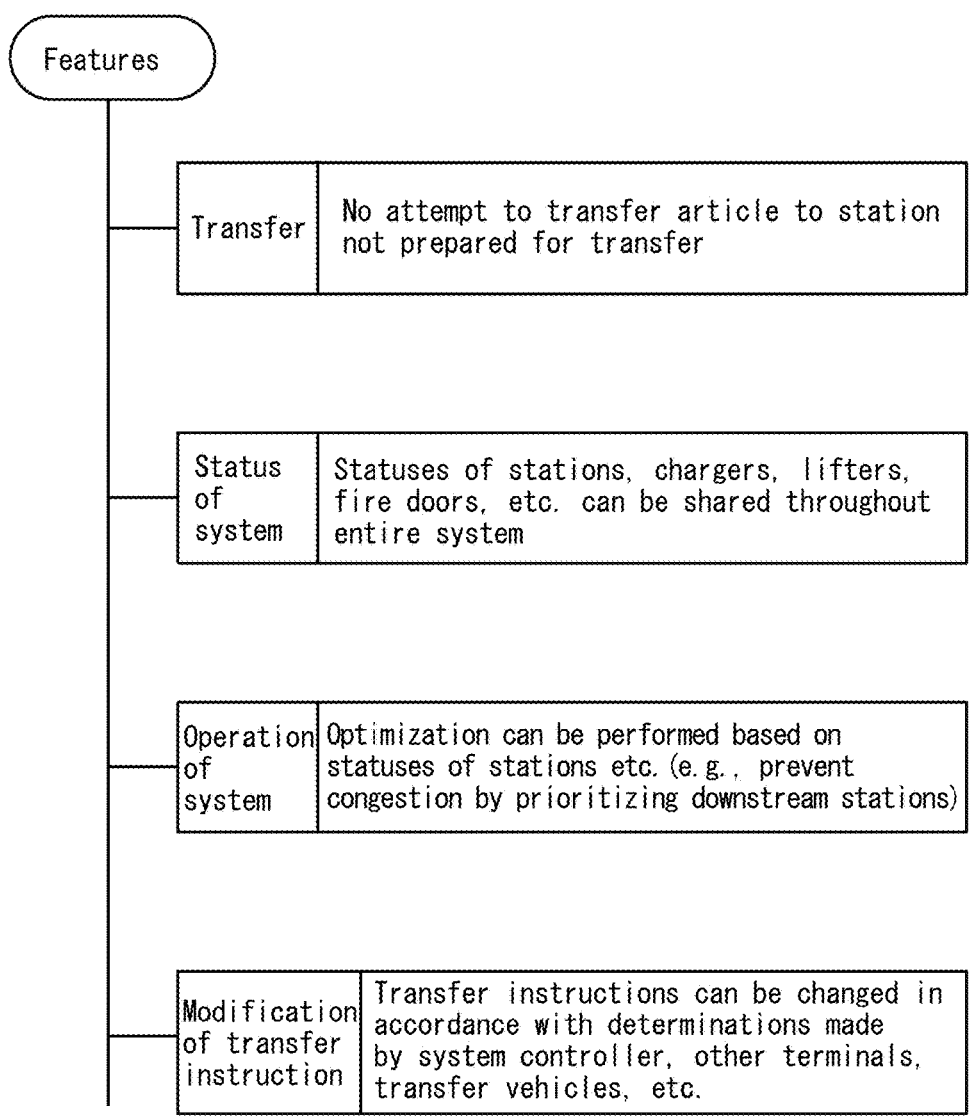
FIG. 12 is a diagram showing features of a preferred embodiment of the present invention.

FIG. 12 shows features of a third preferred embodiment of the present invention including:

1) The statuses of stations are recognized remotely, and therefore an overhead traveler does not decelerate or stop due to transfer with a station that is not prepared for transfer.

2) Status data regarding peripheral devices such as stations, charging apparatuses, lifters, and fire doors are shared throughout the entire communication system 2 via data in the management function 26 belonging to the system controller 24 or via the communication device 18.

3) It is possible to modify transfer instructions and optimize the operation efficiency according to the statuses of stations.

4) Operation rules and transfer instructions are capable of being changed according to determinations made by the system controller 24, the overhead travelers 8, the terminals 58 and 60, and the like. Also, data regarding stations are capable of being analyzed using data in the management function 26.

Figure 13:
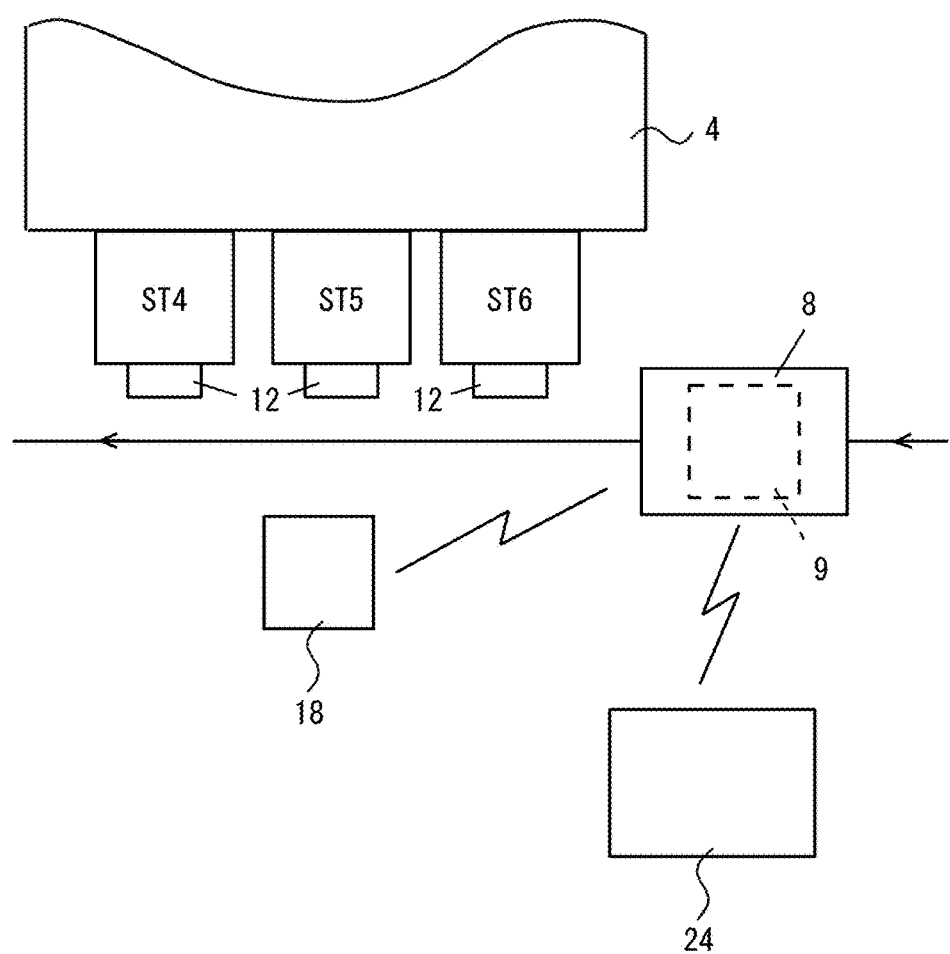
FIG. 13 is a diagram schematically showing a situation in which a station that is to receive a transfer from a transfer vehicle is selected out of a group of stations.

FIG. 13 shows a situation in which an overhead traveler 8 is able to transfer an article 9 to any of the stations ST4 to ST6, and the stations ST4 to ST6 are aligned in order from downstream to upstream. For example, the system controller 24 designates a group of stations to which the article is able be transferred, and entrusts the overhead traveler 8 with the determination of which station in the group the article is to be transferred to. The station to which the article was transferred is then reported to the system controller 24 by the overhead traveler 8. In the situation in FIG. 13, the overhead traveler 8 checks the statuses of the stations ST4 to ST6 via the communication device 18, transfers the article to the most downstream station that is prepared for transfer (e.g., the station ST4), and then after transfer, reports to the system controller 24 that the article was transferred to the station ST4. Note that instead of the system controller 24 designating a group, the group may be described in a traveling route map, and the overhead traveler 8 may autonomously select the station that is to be transferred to.

Fourth Preferred Embodiment

Figure 14:
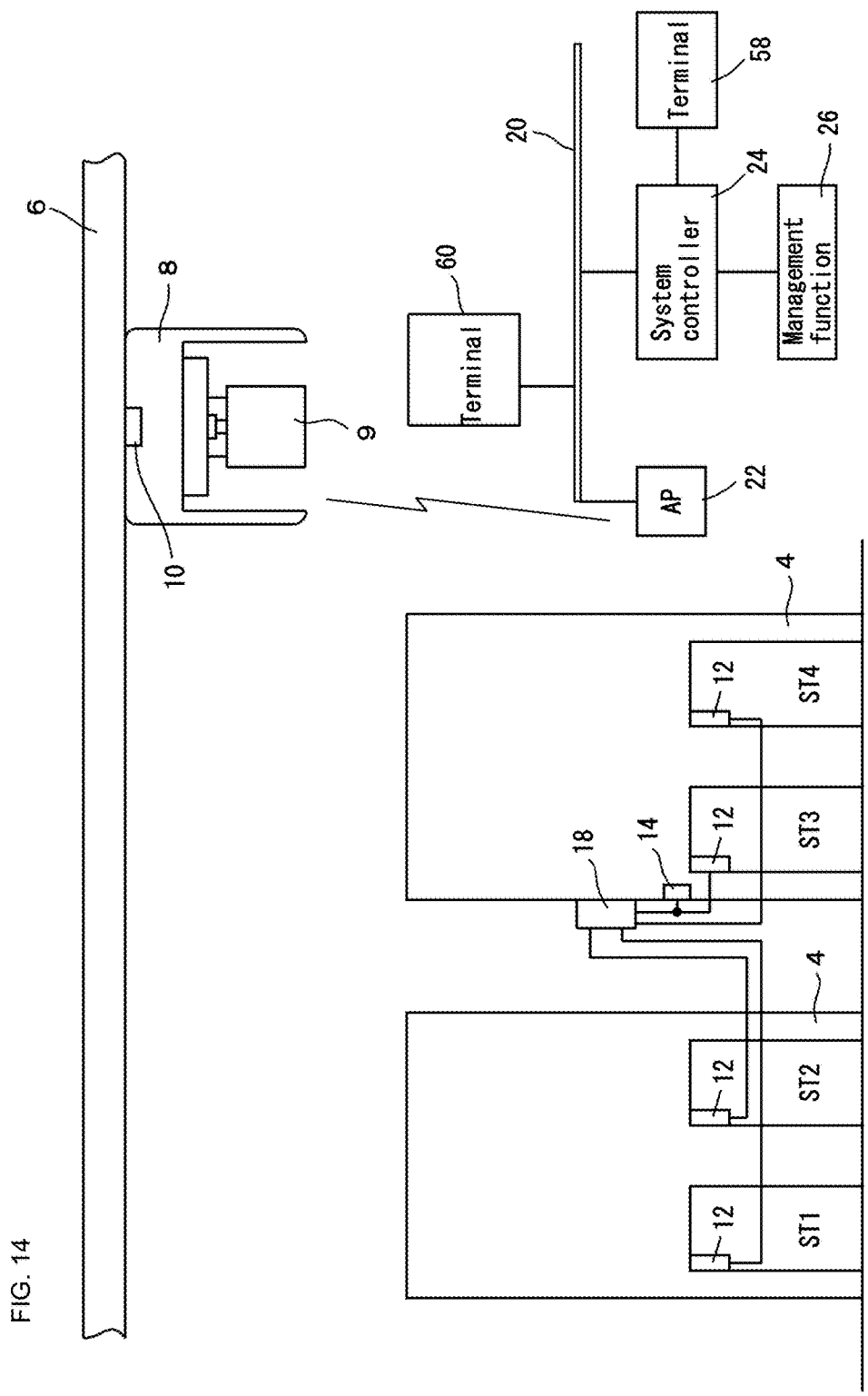
FIG. 14 is a diagram showing a communication system of a preferred embodiment of the present invention and the surrounding environment thereof.
Figure 15:
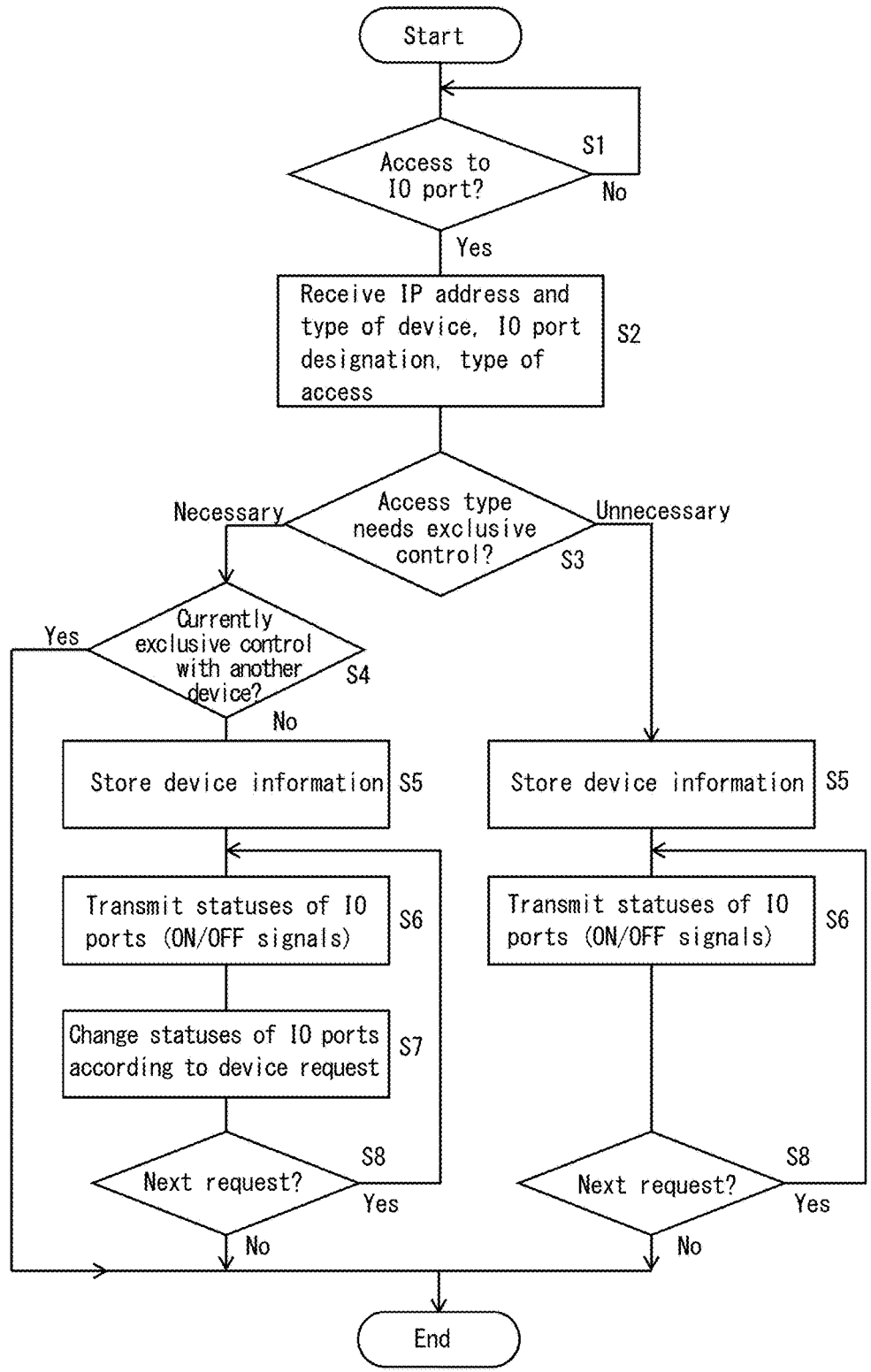
FIG. 15 is a flowchart showing an operation algorithm of a communication device according to a preferred embodiment of the present invention.

FIGS. 14 and 15 show a fourth preferred embodiment of the present invention. The same reference signs as in FIGS. 1 to 13 denote the same members, and aspects not described below are similar to the preferred embodiments in FIGS. 1 to 13. The manufacturing apparatus 4 includes one or more stations ST1 to ST4, the stations ST1 to ST4 are each provided with a station terminal 12 and communicate with the communication device 18 wirelessly or via a wire, and data received from the station terminals 12 and data sent to the station terminals 12 are stored at IO ports of the communication device 18. Also, the station ST3 is provided with the obstacle detector 14, and signals from the obstacle detector 14 are input to the IO port for the station ST3 in the communication device 18. The overhead traveler 8, the system controller 24, and the terminals 58 and 60 communicate with the communication device 18 via the LAN 20 and read the ON/OFF signals of the IO ports, and are capable of changing values of the ON/OFF signals of the IO ports in exclusive control. Also, the ON/OFF signals of the IO ports are stored in the management function 26, and are accessible by the overhead traveler 8, the terminals 58 and 60, the system controller 24, and the like.

FIG. 15 shows processing performed in the communication device 18 according to the fourth preferred embodiment of the present invention. In step 1, the presence and absence of access to the IO ports via the LAN is watched, and if an access is made, the IP address of the device that made the access, the type of device such as the overhead traveler 8, the system controller 24, or the terminal 58, the port number of the designated IO port, and the access type, indicating whether or not exclusive control is required, are received (step 2).

Whether or not exclusive control is necessary is determined in step 3, and if not necessary, information from the device is stored (step 5), the status of the IO port (the ON/OFF signal from the IO port) is transmitted (step 6), and communication is ended if a subsequent request does not exist (step 8). If exclusive control is necessary, but another device is executing exclusive control, communication is denied (step 4). If exclusive control with another device is not being executed, exclusive control is acknowledged, steps 5, 6, and 8 are executed, and a value of the ON/OFF signal of the IO port is changed in step 7. The ON/OFF signal of the IO port is a signal from the transfer system from the viewpoint of the station terminal 12, and a change in the value of the ON/OFF signal corresponds to, for example, a request to start the transfer of an article with a station, confirmation that transfer ended, or the sending of a signal indicating the occurrence of an abnormality during transfer or the like. The overhead traveler 8 then transfers an article to a station while performing exclusive control, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A communication device comprising:
a communication unit configured to communicate with a LAN;
at least one IO port that is connectable to a manufacturing apparatus; and
a controller; wherein
the at least one IO port is configured and/or programmed to exchange an ON/OFF signal including a plurality of bits with the manufacturing apparatus; and
the controller is configured and/or programmed to:
receive communication requests from communication destinations via the LAN, and store network addresses of the communication destinations and data specifying the at least one IO port designated by the communication destinations;
change values of the ON/OFF signal of a designated IO port in accordance with requests from the communication destinations; and
transmit the ON/OFF signal of the designated IO port to the communication destinations via the communication unit and the LAN in accordance with requests from the communication destinations.

2. The communication device according to claim 1, further comprising:
a memory configured to store a presence or an absence of exclusive control of the at least one IO port; wherein
the controller is configured and/or programmed to determine whether or not exclusive control of the designated IO port is necessary based on communication requests from the communication destinations; and
the communication device is configured and/or programmed such that, in a case where communication requests from the communication destinations are received and the controller determines that exclusive control of the designated IO port is necessary:
if statuses of the designated IO port correspond to the absence of exclusive control, the value of the ON/OFF signal of the designated IO port is changed in accordance with requests from the communication destinations, and data in the memory is changed such that exclusive control of the designated IO port is present; and
if statuses of the designated IO port correspond to the presence of exclusive control, changing the values of the ON/OFF signal of the designated IO port is denied; and
in a case where communication requests from the communication destinations are received and the controller determines that exclusive control of the designated IO port is not necessary, the ON/OFF signal of the designated IO port is transmitted to the communication destinations via the communication unit and the LAN in accordance with the requests from the communication destinations regardless of the presence or the absence of exclusive control of the designated IO port.

3. The communication device according to claim 1, further wherein
transfer vehicles configured and/or programmed to transfer articles to and from stations of a manufacturing apparatus, and another controller configured and/or programmed to control a plurality of transfer vehicles define the communication destinations; and
the communication device is configured and programmed to transmit the ON/OFF signal of the designated IO port to the controller via the communication unit.

4. The communication device according to claim 1, wherein the communication device includes a network address, and data specifying the at least one IO port.

5. The communication device according to claim 3, wherein the communication device is configured and/or programmed to enable the controller and one of the transfer vehicles to access the ON/OFF signal of the designated IO port.

6. The communication device according to claim 3, wherein a peripheral device other than the manufacturing apparatus is connected to the at least one IO port, and the peripheral device is configured and/or programmed such that status data regarding the peripheral device is accessible by the controller and a transfer vehicle.

7. A communication apparatus comprising:
the communication device according to claim 1; wherein
transfer vehicles configured and/or programmed to transfer articles to and from stations of a manufacturing apparatus, and another controller configured and/or programmed to control a plurality of transfer vehicles define the communication destinations;
the manufacturing apparatus includes a communication terminal configured and/or programmed such that the communication terminal is able to communicate with the transfer vehicles and is connected to a main body of the manufacturing apparatus by a communication line, and an adapter configured to be inserted into the communication line and be connected to the IO port;
the communication apparatus is configured and/or programmed such that the adapter is capable of switching between:
an adapter pass mode of relaying communication between the communication terminal and the main body and transmitting communication data to the at least one IO port; and
an adapter control mode of relaying communication between the manufacturing apparatus and the at least one IO port if the communication terminal and the main body are not communicating.

8. The communication apparatus according to claim 7, wherein the communication apparatus is configured and/or programmed such that the at least one IO port is capable of switching between a state of being connected to the adapter and a state of directly communicating with a terminal of the manufacturing apparatus.

9. The communication apparatus according to claim 7, wherein the adapter includes a switch inserted into the communication line, and a second communication line branched from the communication line and connected to the IO port; and
the at least one IO port is configured and/or programmed to watch communication with the main body in the adapter control mode and in the adapter pass mode.

10. The communication apparatus according to claim 7, wherein the communication apparatus is configured and/or programmed to, if an abnormality of the communication unit is detected, change the at least one IO port set to the adapter control mode to the adapter pass mode.

11. The communication apparatus according to claim 7, wherein the communication apparatus is configured and/or programmed to receive instructions from transfer vehicles with the communication unit, and change the at least one IO port set to the adapter control mode to the adapter pass mode.

12. A communication system comprising:
- transfer vehicles configured to transfer articles to and from stations of a manufacturing apparatus;
- a controller configured and/or programmed to control transfer vehicles; and
- a manufacturing apparatus-side communication device; wherein the communication device includes a communication unit configured to communicate with a LAN, at least one IO port, and the controller;

the IO port is configured and/or programmed such that the IO port is connectable to the manufacturing apparatus and exchanges an ON/OFF signal including a plurality of bits with the manufacturing apparatus; and the controller is configured and/or programmed to:
- receive communication requests from communication destinations via the LAN, including the transfer vehicles and the controller, and store network addresses of transmission origins of requests from the communication destinations, and data specifying the IO port designated by the communication destinations;
- change values of the ON/OFF signal of a designated IO port in accordance with requests from the communication destinations; and
- transmit the ON/OFF signal of the designated IO port to the communication destinations via the communication unit and the LAN in accordance with requests from the communication destinations.

13. The communication system according to claim 12, wherein the controller is configured and/or programmed to change transfer instructions or stop transfer based on the ON/OFF signal of the designated IO port.

* * * * *